(12) United States Patent
Lien et al.

(10) Patent No.: US 9,691,736 B2
(45) Date of Patent: *Jun. 27, 2017

(54) MINIATURIZED SMD DIODE PACKAGE AND PROCESS FOR PRODUCING THE SAME

(71) Applicant: SFI Electronics Technology Inc., Taoyuan County (TW)

(72) Inventors: Ching-Hohn Lien, Taoyuan County (TW); Xing-Xiang Huang, Taoyuan County (TW); Hsing-Tsai Huang, Taoyuan County (TW); Hong-Zong Xu, Taoyuan County (TW); Yi-Wei Chen, Taoyuan County (TW)

(73) Assignee: SFI ELECTRONICS TECHNOLOGY INC., Taiwan (CN)

(*) Notice: Subject to any disclaimer, the term of this patent is extended or adjusted under 35 U.S.C. 154(b) by 0 days.

This patent is subject to a terminal disclaimer.

(21) Appl. No.: 14/881,558

(22) Filed: Oct. 13, 2015

(65) Prior Publication Data

US 2016/0035697 A1 Feb. 4, 2016

Related U.S. Application Data

(62) Division of application No. 14/585,857, filed on Dec. 30, 2014.

(30) Foreign Application Priority Data

Jan. 10, 2014 (TW) .............................. 103101019 A

(51) Int. Cl.
*H01L 21/00* (2006.01)
*H01L 23/00* (2006.01)
(Continued)

(52) U.S. Cl.
CPC .......... *H01L 24/97* (2013.01); *H01L 21/4853* (2013.01); *H01L 21/4867* (2013.01);
(Continued)

(58) Field of Classification Search
CPC ....... H01L 2924/00; H01L 2924/00014; H01L 2224/73265; H01L 2224/48227;
(Continued)

(56) References Cited

U.S. PATENT DOCUMENTS 5,491,111 A * 2/1996 Tai .................... H01L 23/49562
257/E23.044
6,514,372 B1 * 2/2003 Yamazaki ........... B32B 38/1841
156/256

(Continued)

*Primary Examiner* — Thao X Le
*Assistant Examiner* — Nduka Ojeh
(74) *Attorney, Agent, or Firm* — Bacon & Thomas, PLLC

(57) ABSTRACT

A process for producing a miniaturized SMD diode package involves using a diode chip whose bottom surface has a positive electrode and a negative electrode, using a circuit board instead of a conventional lead frame during packaging, and using Charge-Coupled Device (CCD) image registration technology to perform chip bonding; the beneficial advantages brought from the process for producing the same including to simplify producing process and reduce manufacturing cost, to improve accuracy and precision of producing the miniaturized SMD diode package due to using a circuit board instead of conventionally used lead frame, and to ensure the produced miniaturized SMD diode package possesses excellent diode characteristics without distortion or defect.

2 Claims, 7 Drawing Sheets

(51) Int. Cl.
  *H01L 21/56*     (2006.01)
  *H01L 21/78*     (2006.01)
  *H01L 23/02*     (2006.01)
  *H01L 23/15*     (2006.01)
  *H01L 23/31*     (2006.01)
  *H01L 29/861*    (2006.01)
  *H01L 23/498*    (2006.01)
  *H01L 21/48*     (2006.01)
  *H05K 1/11*      (2006.01)
  *H05K 1/14*      (2006.01)
  *H05K 3/40*      (2006.01)
  *H01L 25/065*    (2006.01)

(52) U.S. Cl.
  CPC ............ *H01L 21/56* (2013.01); *H01L 21/561* (2013.01); *H01L 21/565* (2013.01); *H01L 21/78* (2013.01); *H01L 23/02* (2013.01); *H01L 23/15* (2013.01); *H01L 23/3107* (2013.01); *H01L 23/49805* (2013.01); *H01L 23/49833* (2013.01); *H01L 24/96* (2013.01); *H01L 29/861* (2013.01); *H05K 1/117* (2013.01); *H05K 1/144* (2013.01); *H05K 1/145* (2013.01); *H05K 3/403* (2013.01); *H01L 24/27* (2013.01); *H01L 24/29* (2013.01); *H01L 24/32* (2013.01); *H01L 24/33* (2013.01); *H01L 24/83* (2013.01); *H01L 25/0652* (2013.01); *H01L 2224/06181* (2013.01); *H01L 2224/2732* (2013.01); *H01L 2224/27312* (2013.01); *H01L 2224/29294* (2013.01); *H01L 2224/29311* (2013.01); *H01L 2224/29339* (2013.01); *H01L 2224/29344* (2013.01); *H01L 2224/29347* (2013.01); *H01L 2224/29355* (2013.01); *H01L 2224/29364* (2013.01); *H01L 2224/29369* (2013.01); *H01L 2224/32168* (2013.01); *H01L 2224/32227* (2013.01); *H01L 2224/33181* (2013.01); *H01L 2224/83101* (2013.01); *H01L 2224/83191* (2013.01); *H01L 2224/83192* (2013.01); *H01L 2224/83801* (2013.01); *H01L 2224/83851* (2013.01); *H01L 2224/92* (2013.01); *H01L 2224/97* (2013.01); *H01L 2924/1203* (2013.01); *H01L 2924/12032* (2013.01); *H01L 2924/12035* (2013.01); *H01L 2924/12036* (2013.01); *H01L 2924/1579* (2013.01); *H01L 2924/15787* (2013.01); *H01L 2924/15798* (2013.01); *H01L 2924/181* (2013.01); *H01L 2924/186* (2013.01)

(58) Field of Classification Search
  CPC ..... H01L 2924/181; H01L 2224/48091; H01L 2924/014; H01L 2924/12035; H01L 24/97; H01L 23/3107; H01L 24/48; H01L 24/83; H01L 23/15; H01L 21/56; H01L 21/78; H01L 23/02
  USPC ........... 438/25, 51, 55, 64, 26, 15, 106–127; 257/81, 678–733, 734–796, 676, 666, 257/E33.056, E33.062, 99, E21.502, 257/E21.599, E23.039, E23.052, E33.059, 257/E23.001, E23.061, E21.499
  See application file for complete search history.

(56) References Cited

U.S. PATENT DOCUMENTS

| | | | |
|---|---|---|---|
| 2003/0173577 A1* | 9/2003 | Yoon .................... | H01L 23/3114 257/99 |
| 2003/0174482 A1* | 9/2003 | Yoon ...................... | H01L 21/78 361/767 |
| 2006/0215342 A1* | 9/2006 | Montoya ................ | H01C 1/148 361/103 |
| 2009/0093136 A1* | 4/2009 | Hiew .................... | G06F 1/1632 439/55 |
| 2012/0286410 A1* | 11/2012 | Groenhuis ........ | H01L 23/49548 257/676 |
| 2013/0222101 A1* | 8/2013 | Ito ........................... | H01F 17/04 336/83 |

* cited by examiner

MINIATURIZED SMD DIODE PACKAGE AND PROCESS FOR PRODUCING THE SAME

CROSS REFERENCE TO RELATED APPLICATIONS

This application is a divisional of U.S. application Ser. No. 14/585,857, filed Dec. 30, 2014, which is incorporated by reference herein in its entirety.

BACKGROUND OF THE PRESENT INVENTION

1. Field of the Invention

The present invention relates to surface-mount device (SMD) diode packages, and more particularly to a miniaturized SMD diode package having a circuit board used instead of a conventional lead frame, and a process for producing the same.

2. Description of Related Art

In a given process for making IC or semiconductor packages (or called IC devices), lead frames are conventionally used to hold IC or semiconductor dies (or called IC chips) and further make an electrical connection with the IC chips before performing package of epoxy resin and formed as IC devices.

The lead frame after packaged acts as an inner electrode for the IC devices and further has pins (or contacting points) exposed outside to be worked as outer electrodes for the same IC devices. Therefore, IC device can be connected to a printed circuit board (PCB) via outer electrodes formed from so-called lead frame and to transmit workable functions from IC chips to the PCB, and vice versa.

Accordingly, a lead frame is an essential element for packaging IC chips. Depending on IC chips possessing what function, usage, shape and/or size, various different lead frames are designed for use in packaging those IC chips.

To take a miniaturized SMD diode package as an example, since a miniaturized diode package has a package size like chip scale, it is hardly to allow miniaturized diode chips are accurately and precisely installed on so-called lead frame. The inevitable problem is that a miniaturized diode package leads to have distortion and even failure if inaccurately packaged with lead frames for diode chips.

Therefore, the conventional packaging method that uses lead frames acted as inner electrodes and also as outer electrodes for diode chips do not suitably apply for use in producing the miniaturized SMD diode package.

SUMMARY OF THE INVENTION

In view of this, for improving the existing packaging process for miniaturized SMD diode packages, the present invention discloses a process for producing miniaturized SMD diode packages involves using a diode chip whose bottom surface has a positive electrode and a negative electrode, using a circuit board instead of a conventional lead frame during packaging, and using Charge-Coupled Device (CCD) image registration technology to perform chip bonding.

The beneficial advantages brought from the disclosed process for producing miniaturized SMD diode packages include:

1. to simplify producing process and reduce manufacturing cost;
2. to improve accuracy and precision of producing the miniaturized SMD diode package due to using a circuit board instead of the conventionally used lead frame;
3. to ensure the produced miniaturized SMD diode package possesses excellent diode characteristics without distortion or defect; and
4. to produce increasingly miniaturized SMD electronic devices more suitable.

DETAILED DESCRIPTION OF THE INVENTION

Figure 1:
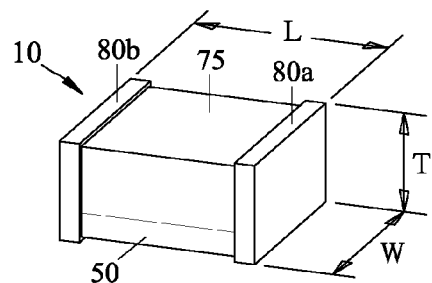
FIG. 1 is a schematic drawing showing a SMD diode chip package of the present invention.
Figure 3:
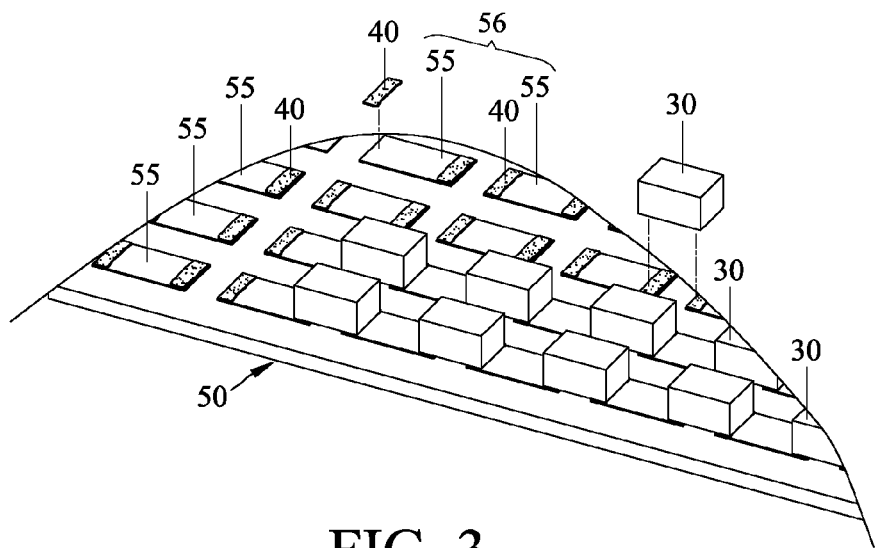
FIG. 3 depicts the SMD diode chip package of FIG. 1 or FIG. 2 in the course of packaging process using a circuit board instead of the conventionally used lead frame to make electrical connections with one or more diodes chips.

Referred to FIGS. 1 and 3, a SMD diode chip package 10 of the present invention is herein defined as a diode package miniaturized in whole package size like chip scale and having two ends formed with outer electrodes 80a, 80b respectively.

The SMD diode chip package 10 is packaged with a single diode chip 30 and has three basic features including: using a circuit board instead of the conventionally used lead frame, containing no outer pins extended from the so-called lead frame, and possessing excellent diode characteristics.

The SMD diode chip package 10 of the present invention contains four embodiments described as follows.

Figure 5:
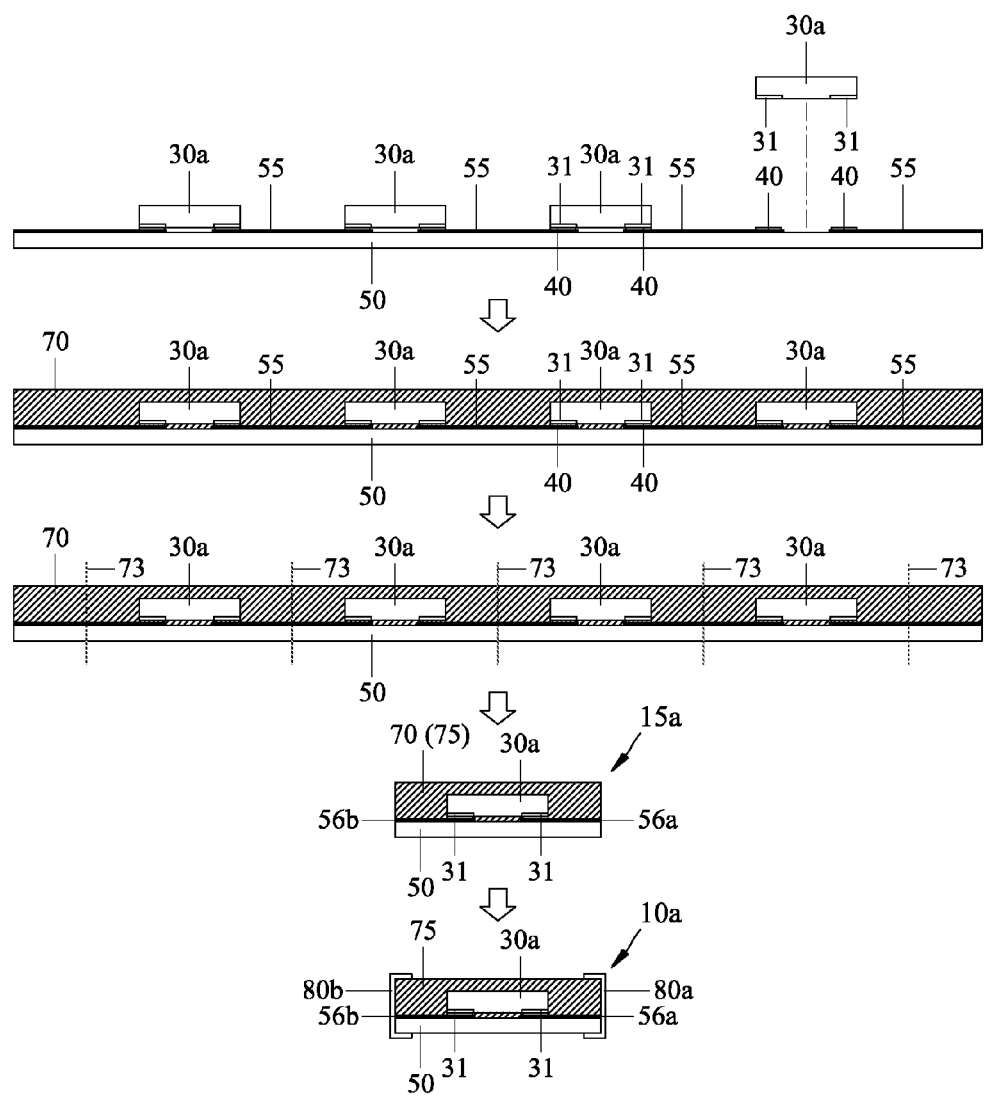
FIG. 5 is an illustrating drawing to show how to produce a first embodiment of SMD diode chip package of the present invention.

Referred to FIGS. 1, 3 and 5, formed as a first embodiment of the present invention, a diode package 10a is composed of a diode chip 30a, a bottom circuit board 50, two circuit electrodes 56a, 56b, an encapsulation 75 and two outer electrodes 80a, 80b.

The diode chip 30a for having function of electrical connection has its bottom surface provided with two lower electrodes 31 acting as a positive electrode and a negative electrode, respectively.

The circuit electrodes 56a, 56b are separately deposited on the bottom circuit board 50, and each corresponds to and electrically connects to the corresponding lower electrode 31 of the diode chip 30a, respectively.

The encapsulation 75 is attached to the bottom circuit board 50 and integrated with the bottom circuit board 50 as an integrated structure, so that the diode chip 30a and the circuit electrodes 56a, 56b are contained therein, and the circuit electrodes 56a, 56b each have one end extended to and exposed at one end of the encapsulation 75.

The outer electrodes 80a, 80b each cover one end of the integrated structure formed by the encapsulation 75 and the bottom circuit board 50, and each are electrically connected to the corresponding circuit electrode 56a, 56b, respectively.

Figure 6:
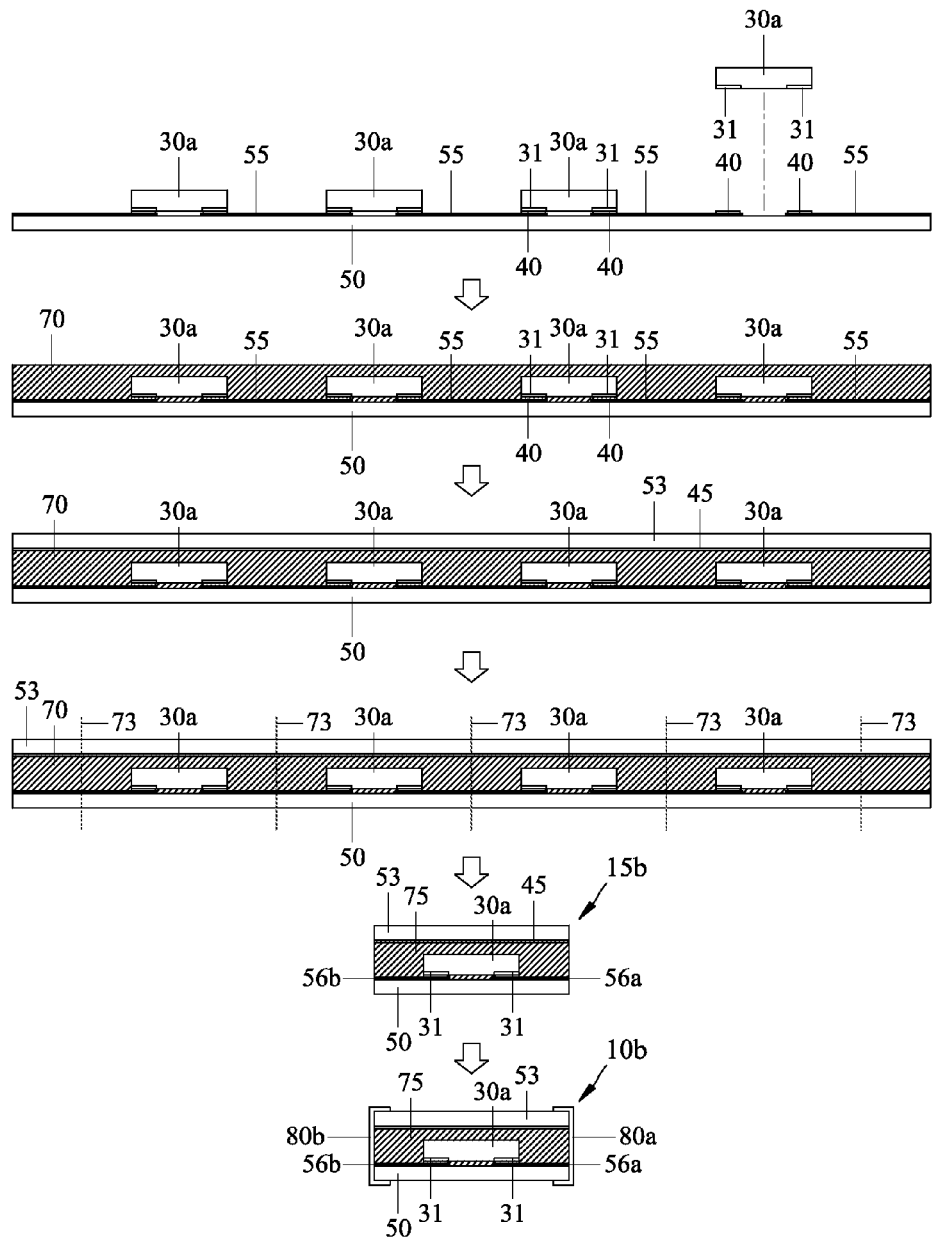
FIG. 6 is an illustrating drawing to show how to produce a second embodiment of SMD diode chip package of the present invention.

Referred to FIG. 6, formed as a second embodiment of the present invention, a diode package 10b comprises all basic structures presented on the aforesaid diode package 10a, and further has an upper cover 53 that is attached to a top surface of the encapsulation 75 and forms an integrated structure together with the encapsulation 75 and the bottom circuit board 50.

Accordingly, the outer electrodes 80a, 80b each cover one end of the integrated structure formed by the upper cover 53, the encapsulation 75 and the bottom circuit board 50, and each are electrically connected to the corresponding circuit electrode 56a, 56b, respectively.

Figure 8:
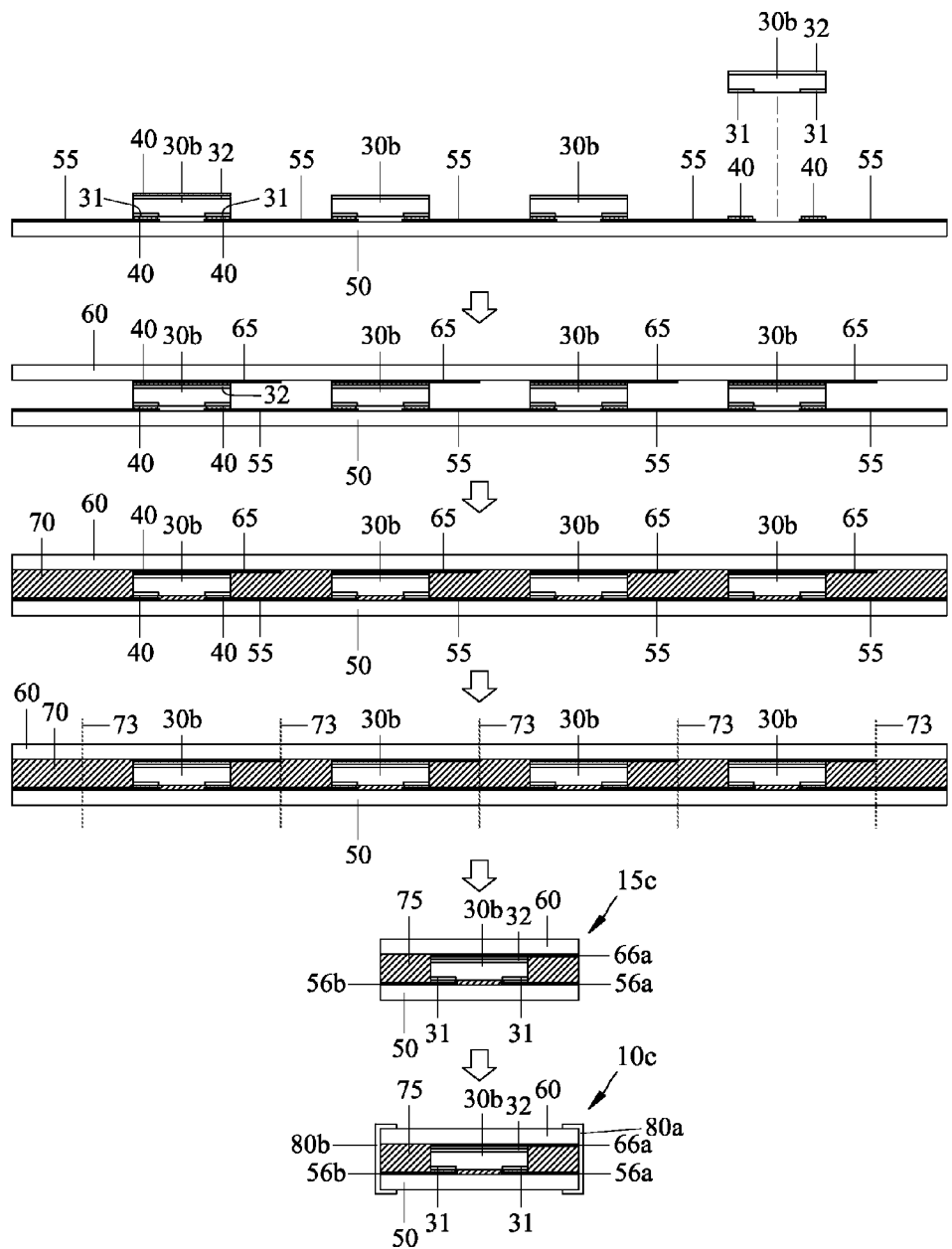
FIG. 8 is an illustrating drawing to show how to produce a third embodiment of SMD diode chip package of the present invention.

Referred to FIGS. 1, 3 and 8, formed as a third embodiment of the present invention, a diode package 10c is composed of a diode chip 30b having three electrodes, a bottom circuit board 50, two circuit electrodes 56a, 56b, a top circuit board 60, an upper circuit electrode 66a, an encapsulation 75 and two outer electrodes 80a, 80b.

The diode chip 30b for increasing current capacity has its bottom surface provided with two lower electrodes 31 acting as a positive electrode and a negative electrode respectively, and has its top surface provided with a higher electrode 32 acting as a positive electrode or a negative electrode.

The circuit electrodes 56a, 56b are separately deposited on the bottom circuit board 50, and each corresponds to and electrically connects to the corresponding lower electrode 31 of the diode chip 30b, respectively.

The upper circuit electrode 66a is deposited on the top circuit board 60, and corresponds to and electrically connects to the higher electrode 32 of the diode chip 30b.

The encapsulation 75 is attached between the bottom circuit board 50 and the top circuit board 60 as well as integrated with them as an integrated structure, so that the diode chip 30b, the circuit electrodes 56a, 56b and the upper circuit electrode 66a are all contained therein, and the circuit electrodes 56a, 56b and the upper circuit electrode 66a each have one end extended to and exposed at one end of the encapsulation 75.

The outer electrodes 80a, 80b each cover one end of the integrated structure formed by the bottom circuit board 50, the encapsulation 75 and the top circuit board 60, and each are electrically connected to the corresponding circuit electrode 56a, 56b and one of them is further electrically connected to the upper circuit electrode 66a, respectively.

Figure 9:
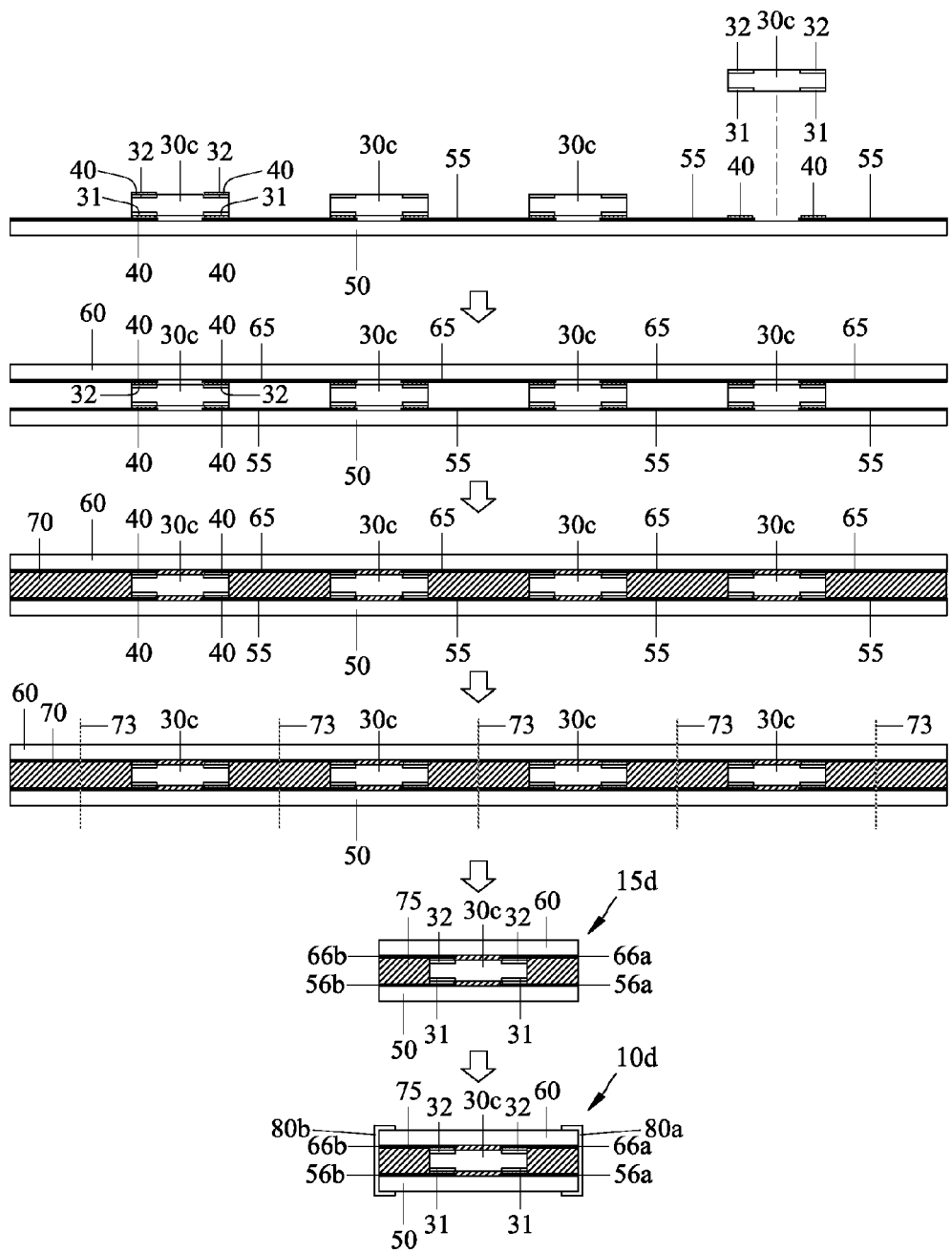
FIG. 9 is an illustrating drawing to show how to produce a fourth embodiment of SMD diode chip package of the present invention.

Referred to FIGS. 1, 3 and 9, formed as a fourth embodiment of the present invention, a diode package 10d is composed of a diode chip 30c having four electrodes, a bottom circuit board 50, two circuit electrodes 56a, 56b, a top circuit board 60, two upper circuit electrodes 66a, 66b, an encapsulation 75 and two outer electrodes 80a, 80b.

The diode chip 30c for increasing current capacity has its bottom surface provided with two lower electrodes 31 acting as a positive electrode and a negative electrode, and has its top surface provided with two higher electrode 32 acting as a positive electrode and a negative electrode, respectively.

The circuit electrodes 56a, 56b are separately deposited on the bottom circuit board 50, and each corresponds to as well as electrically connects to the corresponding lower electrode 31 of the diode chip 30c, respectively.

The upper circuit electrodes 66a, 66b are separately deposited on the top circuit board 60, and each corresponds to as well as electrically connects to the corresponding higher electrode 32 of the diode chip 30c, respectively.

Accordingly, the outer electrodes 80a, 80b each cover one end of the integrated structure formed by the bottom circuit board 50, the encapsulation 75 and the top circuit board 60, and each are electrically connected to the corresponding circuit electrode 56a, 56b as well as the corresponding upper circuit electrode 66a, 66b, respectively.

Figure 2:
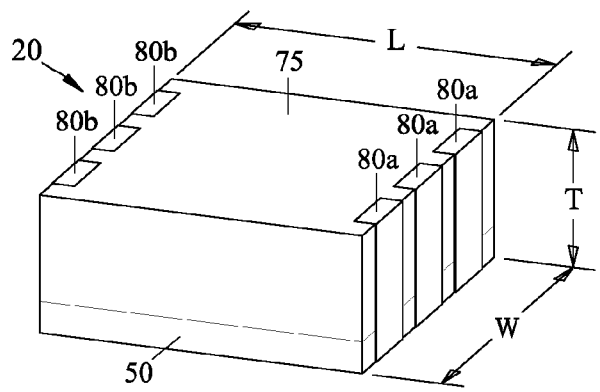
FIG. 2 is a schematic drawing showing another embodiment of an array-type SMD diode chip package of the present invention.

Referred to FIG. 2, another alternative embodiment of the present invention is to disclose an array-type SMD diode chip package 20 (also abbreviated as diode array package 20) is formed from being packaged with two or more diode chips 30a, 30b or 30c that are separated and arranged into an array. The diode array package 20 has such an infrastructure like the aforesaid SMD diode chip package 10 has disclosed, which basic structure at least comprises a bottom circuit board 50, an encapsulation 75 to encase two or more diode chips 30a, 30b or 30c, and two or more pairs of outer electrodes 80a, 80b electrically connected to the corresponding diode chip 30a, 30b or 30c, respectively.

For example, a first diode array package 20 has one encapsulation 75 to encase two identical diode chips 30a each having two lower electrodes 31; the bottom circuit board 50 has deposited two pairs of circuit electrodes 56a and 56b, and each pair corresponds to as well as electrically connects to the corresponding lower electrode 31 of each corresponding diode chip 30a, respectively; and each pair of outer electrodes 80a and 80b corresponds to each corresponding diode chip 30a and is separately arranged on two opposite ends of the encapsulation 75 as well as electrically connects to each corresponding pair of circuit electrodes 56a and 56b, respectively.

Similarly, a second diode array package 20 has one encapsulation 75 to encase two identical diode chips each one is chosen from the diode chip 30b having three electrodes (or the diode chips 30c having four electrodes). The diode array package 20 further have a top circuit board 60 deposited with an upper circuit electrode 66a (or a pair of upper circuit electrodes 66a and 66b), and said upper circuit electrode 66a (or said pair of upper circuit electrodes 66a and 66b) corresponds to as well as electrically connects to the corresponding higher electrode 32 of each corresponding diode chip 30b (or 30c), respectively. And, each pair of outer electrodes 80a and 80b corresponds to each corresponding diode chip 30b (or 30c) and is separately arranged on two opposite ends of the encapsulation 75 as well as electrically connects to each corresponding pair of circuit electrodes 56a and 56b, and said corresponding upper circuit electrode 66a (or said pair of upper circuit electrodes 66a and 66b), respectively.

Referred to FIGS. 1, 2 and 3, a process for producing a miniaturized SMD diode chip package 10 or diode array package 20 of the present invention has the following specific features so different from the existing packaging process for making SMD diode packages:

1. In the course of packaging process, a bottom circuit board 50 is used instead of the conventionally used lead frame for packaging;
2. Referred to FIG. 3, the bottom circuit board 50 has deposited with plural thin-film or thick-film circuits 55 that are separated and arranged into an array (hereinafter referred to as arrayed film circuits 55); and two arrayed film circuits 55 which are located at positions separated from and adjacent to each other on the bottom circuit board 50 is hereinafter referred to as two spaced and arrayed film circuits 56;

3. Process of paste dispensing is performed using CCD image registration on two ends of each arrayed film circuit 55 of the bottom circuit board 50, so that lead-free conductive pastes 40 are accurately printed and dispensed to predetermined locations thereof; and 4. Process of chip bonding is performed using CCD image registration, so that as shown in FIG. 3 a miniaturized diode chip 30 can have its own positive and negative electrodes already formed on its bottom surface accurately aligned with one corresponding end of two spaced and arrayed film circuits 56 of the bottom circuit board 50 respectively. More particularly, through the lead-free conductive paste 40 coated at the corresponding positions, the positive and negative electrodes of diode chip 30 due to making electrical connection with two spaced and arrayed film circuits 56 are without a risk of short circuit.

Figure 4:
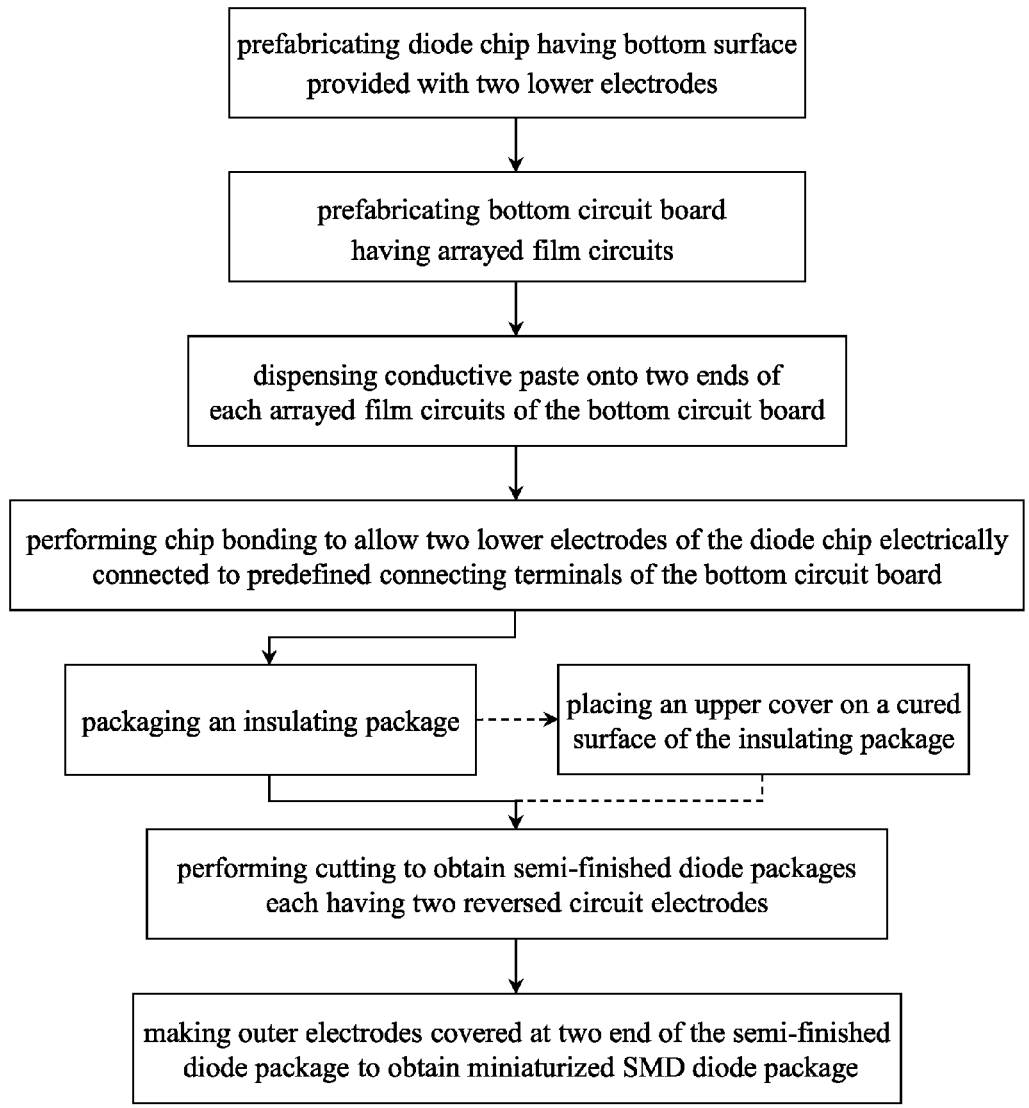
FIG. 4 is a flowchart for producing a first or second embodiment of SMD diode chip package of the present invention.

Referred to FIG. 4 and FIG. 5, the process for producing a miniaturized SMD diode package 10*a* of the first embodiment of the present invention comprises steps of:

A1. prefabricating a diode chip 30*a* having a bottom surface provided with two lower electrodes 31 acting as a positive electrode and a negative electrode;

A2. prefabricating a bottom circuit board 50 having arrayed film circuits 55;

A3. performing paste dispensing via CCD image registration to print or dispense lead-free conductive paste 40 onto two ends of each arrayed film circuits 55 of the bottom circuit board 50;

A4. as shown in FIG. 3, taking every two opposite corresponding ends of two spaced and arrayed film circuits 56 of the bottom circuit board 50 as predefined connecting terminals, and performing chip bonding via CCD image registration to allow the two lower electrodes 31 of the diode chip 30*a* are securely and electrically connected to the predefined connecting terminals of the bottom circuit board 50 through the lead-free conductive paste 40;

A5. performing packaging an insulating package 70 to encase every diode chip 30*a* and every arrayed film circuit 55, which is performed through using an insulating material packaged on the bottom circuit board 50 after chip bonding;

A6. defining cutting lines 73 across every arrayed film circuit 55 of the bottom circuit board 50 via CCD image registration, and making semi-finished diode packages 15*a* obtained from cutting the insulating package 70 and the bottom circuit board 50 along the cutting lines 73 to allow every arrayed film circuit 55 deposited on the bottom circuit board 50 is cut into two separate circuit electrodes, i.e., the semi-finished diode packages 15*a* is composed of the diode chip 30*a*, the bottom circuit board 50, two circuit electrodes 56*a*, 56*b* formed from cutting of the arrayed film circuit 55 and an encapsulation 75 formed from cutting of the insulating package 70;

A7. performing a coating, silver-dipping or film-making process to form outer electrodes 80*a*, 80*b* on two ends of the semi-finished diode packages 15*a*, and making the outer electrodes 80*a*, 80*b* electrically connected to the corresponding circuit electrodes 56*a*, 56*b* to obtain the diode package 10*a* of the first embodiment.

Referred to FIG. 4 and FIG. 6, the process for producing a miniaturized SMD diode package 10*b* of the second embodiment of the present invention comprises steps of:

B1. Same as Step A1;
B2. Same as Step A2;
B3. Same as Step A3;
B4. Same as Step A4;
B5. Same as Step A5;

B6. coating an adhesive layer 45 on a cured surface of the insulating package 70 and covering an upper cover 53 thereon;

B7. Similar to Step A6 to obtain a semi-finished diode packages 15*b* composed of the diode chip 30*a*, the bottom circuit board 50, two circuit electrodes 56*a*, 56*b* formed from cutting of the arrayed film circuit 55, an encapsulation 75 formed from cutting of the insulating package 70 and an upper cover 53;

B8. Similar to Step A7 to make outer electrodes 80*a*, 80*b* on two ends of semi-finished diode packages 15*b* and obtain the diode package 10*b* of the second embodiment.

Figure 7:
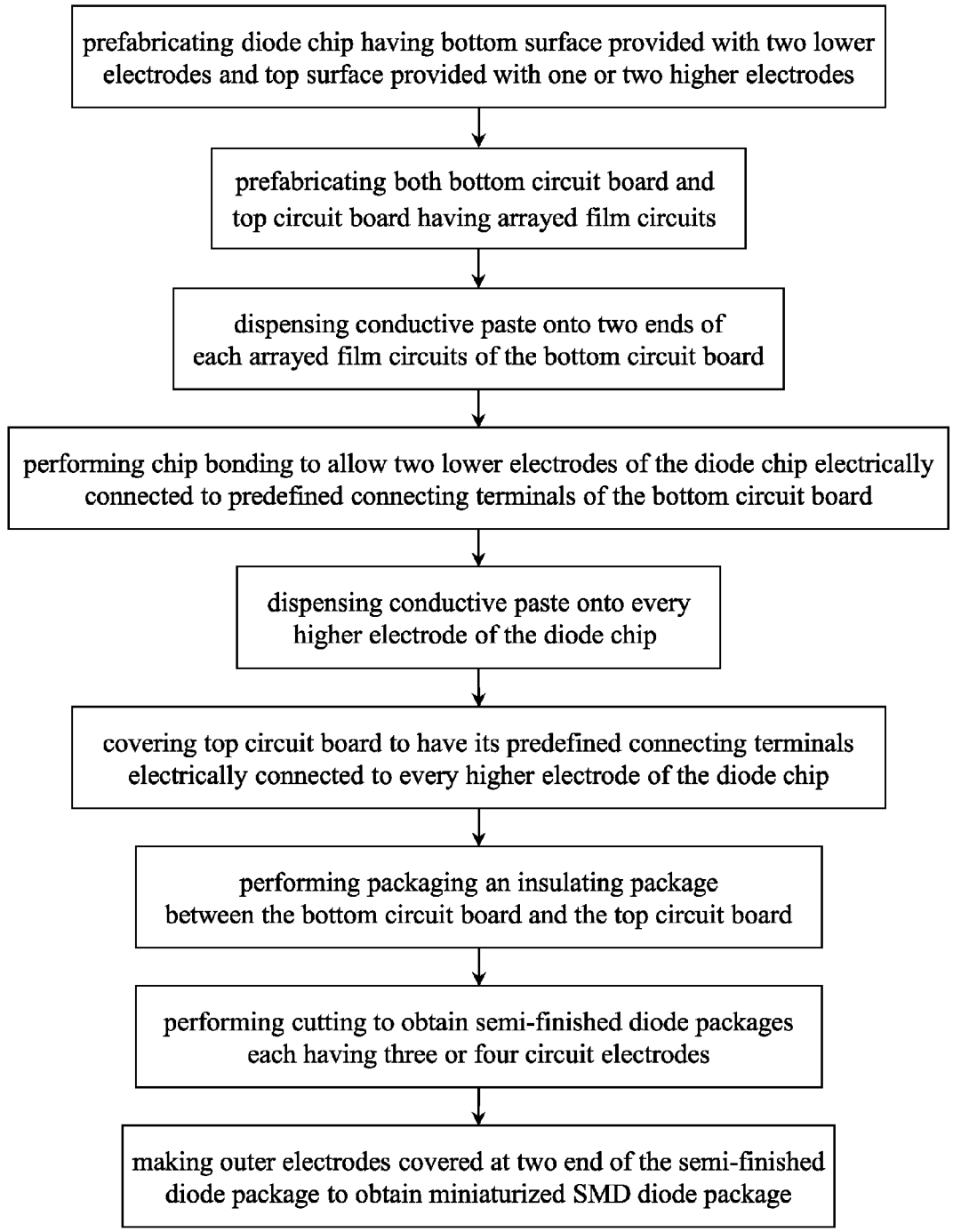
FIG. 7 is a flowchart for producing a third or fourth embodiment of SMD diode chip package of the present invention.

Referred to from FIG. 7 to FIG. 9, the process for producing a miniaturized SMD diode package 10*c* (or 10*d*) of the third (or the fourth) embodiment of the present invention comprises steps of:

C1. prefabricating a diode chip 30*b* (or 30*c*) having a bottom surface provided with two lower electrodes 31 and having a top surface provided with a higher electrode 32 (or two higher electrodes 32);

C2. prefabricating a bottom circuit board 50 having arrayed film circuits 55 deposited thereon and a top circuit board 60 having arrayed film circuits 65 deposited thereon;

C3. performing paste dispensing via CCD image registration to print or dispense lead-free conductive paste 40 onto two ends of each arrayed film circuits 55 of the bottom circuit board 50;

C4. performing chip bonding via CCD image registration to allow the two lower electrodes 31 of the diode chip 30*b* (or 30*c*) are securely and electrically connected to predefined connecting terminals of the bottom circuit board 50 through the lead-free conductive paste 40 of Step C3;

C5. performing paste dispensing via CCD image registration to print or dispense lead-free conductive paste 40 onto every higher electrode 32 of the diode chip 30*b* (or 30*c*);

C6. performing covering with top circuit board 60 via CCD image registration to allow predefined connecting terminals of the top circuit board 60 accurately connected to the higher electrodes 32 of the diode chip 30*b* (or 30*c*) through the lead-free conductive paste 40 of Step C5;

C7. performing packaging an insulating package 70 to encase every diode chip 30*b* (or 30*c*) and every arrayed film circuit 55 and 65, which is performed through using an insulating material packaged on the space between the bottom circuit board 50 and the top circuit board 60 after chip bonding;

C8. defining cutting lines 73 across every arrayed film circuit 55 of the bottom circuit board 50 via CCD image registration, and making semi-finished diode packages 15*c* (or 15*d*) obtained from cutting the top circuit board 60, the insulating package 70 and the bottom circuit board 50 along the cutting lines 73;

C9. performing a coating, silver-dipping or film-making process to form outer electrodes 80*a*, 80*b* on two ends of the semi-finished diode packages 15*c* (or 15*d*), and making the outer electrodes 80*a*, 80*b* electrically connected to the corresponding circuit electrodes 56*a*, 56*b* and 66*a* (or 56*a*, 56*b*, 66*a* and 66*b*) to obtain the diode package 10*c* (or 10*d*) of the third (o fourth) embodiment of the present invention.

The diode chip 30 for use in making the SMD diode chip package 10 or the diode array package 20 of the present invention is preferably chosen from a transient voltage suppression diode (TVS diode), a Schottky diode, a switch diode, a Zener diode or a rectifier diode, but not limited.

Accordingly, the SMD diode chip package 10 or the diode array package 20 of the present invention is preferably a TVS diode package, a Schottky diode package, a switch diode package, a Zener diode package or a rectifier diode package, but not limited.

As shown in FIG. 3, the arrayed film circuit 55 (or 65) of the bottom circuit board 50 (or the top circuit board 60) is acted as inner electrodes for use in making the SMD diode chip package 10 or the diode array package 20 of the present invention.

The insulating package 70 or the encapsulation 75 for use in making the SMD diode chip package 10 or the diode array package 20 of the present invention is formed from a ceramic material or a plastic material, preferably formed from an epoxy resin.

The bottom circuit board 50 or the top circuit board 60 for use in making the SMD diode chip package 10 or the diode array package 20 of the present invention is formed from a ceramic plate, a plastic plate, a composite sheet or a heat-dissipated plate, wherein the ceramic plate is chosen from an alumina plate or an aluminum nitride plate; the plastic plate is chosen from PE plate, PP plate, PC plate or polyamide plate; and the composite sheet is formed from carbon fiber plate or glass fiber plate.

The outer electrodes 80a, 80b for use in making the SMD diode chip package 10 or the diode array package 20 of the present invention are formed from one or more lead-free conductive metals or its alloys selected from the group consisting of silver (Ag), tin (Sn), copper (Cu), gold (Au), nickel (Ni), palladium (Pd) and platinum (Pt), but not limited.

The lead-free conductive paste 40 for use in making the SMD diode chip package 10 or the diode array package 20 of the present invention contains one or more lead-free conductive metals selected from the group consisting of silver (Ag), tin (Sn), copper (Cu), gold (Au), nickel (Ni), palladium (Pd) and platinum (Pt), but not limited.

Due to using a circuit board instead of the conventionally used lead frame, the process for producing a miniaturized SMD diode package of the present invention helps to improve setting accuracy during packaging miniaturized diode chips, and more suitably uses for producing a diode chip package 10 shown in FIG. 1 that has a length (L) of 0.4-1.0 mm, a width (W) of 0.2-0.5 mm and a thickness (T) of 0.2-0.5 mm, preferably producing those diode chip packages 10 with specific specification listed in Table 1.

TABLE 1

| SMD diode chip package (sizes code) | Number of Outer Electrodes | Length (L) | Width (W) | Thickness (T) |
|---|---|---|---|---|
| Chip Scale (01005) | 2 | 0.4 ± 0.1 mm | 0.2 ± 0.1 mm | Max 0.2 mm |
| Chip Scale (0201) | 2 | 0.6 ± 0.1 mm | 0.3 ± 0.1 mm | Max 0.3 mm |
| Chip Scale (0402) | 2 | 1.0 ± 0.1 mm | 0.5 ± 0.1 mm | Max 0.5 mm |

The disclosed manufacturing method is also suitable for the diode array package 20 shown in FIG. 2 that has a length (L) of 1.0-2.4 mm a width (W) of 0.5-1.0 mm and a thickness (T) of 0.4-0.8 mm. Preferably, it is used to make the diode array package 20 with the specification listed in Table 2.

The process for producing a miniaturized SMD diode package of the present invention also suitably uses for producing a diode array package 20 shown in FIG. 2 that has a length (L) of 1.0-2.4 mm a width (W) of 0.5-1.0 mm and a thickness (T) of 0.4-0.8 mm, preferably producing those diode chip packages 10 with specific specification listed in Table 2.

TABLE 2

| SMD diode chip package (sizes code) | Number of Outer Electrodes | Length (L) | Width (W) | Thickness (T) |
|---|---|---|---|---|
| Array-type Chip Scale (0204) | ≤4 | 1.0 ± 0.1 mm | 0.5 ± 0.1 mm | Max 0.4 mm |
| Array-type Chip Scale (0306) | ≤6 | 1.6 ± 0.1 mm | 0.8 ± 0.1 mm | Max 0.7 mm |
| Array-type Chip Scale (0405) | ≤6 | 1.3 ± 0.1 mm | 1.0 ± 0.1 mm | Max 0.8 mm |
| Array-type Chip Scale (0508) | ≤8 | 2.0 ± 0.2 mm | 1.3 ± 0.2 mm | Max 0.8 mm |
| Array-type Chip Scale (0410) | ≤10 | 2.4 ± 0.2 mm | 1.0 ± 0.2 mm | Max 0.8 mm |

Moreover, the process for producing a miniaturized SMD diode package of the present invention due to no use of lead-containing tin paste conforms to requirements for environmental protection.

What is claimed is:
1. A process for producing a miniaturized surface-mount device (SMD) diode package having a miniaturized size of a length (L) of 0.4-1.0 mm, a width (W) of 0.2-0.5 mm and a thickness (T) of 0.2-0.5 mm, composed of the steps of:
   1) prefabricating a diode chip formed from a transient voltage suppression (TVS) diode, a Schottky diode, a switch diode, a Zener diode or a rectifier diode, and having a bottom surface of which surface area is provided with a positive electrode and a negative electrode formed thereon and spaced apart each other;
   2) prefabricating a bottom circuit board formed from a ceramic plate, a plastic plate, a composite sheet or a heat-dissipated plate and each having plural arrayed film circuits deposited thereon and each arrayed film circuit located in such a position spaced apart and adjacent to the other;
   3) performing paste dispensing via charge-coupled device (CCD) image registration to print or dispense lead-free conductive paste onto two ends of each arrayed film circuits of the bottom circuit board of step 2);
   4) performing chip bonding via CCD image registration to allow the positive electrode and the negative electrode of the diode chip of step 1) are through the lead-free conductive paste securely and electrically connected to two adjacent arrayed film circuits of the bottom circuit board of step 3);
   5) performing packaging an insulating package formed from a ceramic material or a plastic material to encase every bonded diode chip of step 4) and every arrayed film circuit on the bottom circuit board of step 4);
   6) optionally performing coating an adhesive layer on a cured surface of the insulating package and placing an upper cover thereon;
   7) defining cutting lines across every arrayed film circuit of the bottom circuit board of step 5) and then performing cutting along the defined cutting lines via CCD image registration to obtain semi-finished diode packages each having two reversed circuit electrodes of which each has one end respectively exposed at one opposite end of the semi-finished diode package thereof; and 8) making outer electrodes covered at two end of the semi-finished diode package and electrically connected to the corresponding exposed circuit electrodes of the semi-finished diode package of step 7) via a coating, silver-dipping or film-making process, thereby the miniaturized SMD diode package is obtained.

2. A process for producing a miniaturized surface-mount device (SMD) diode package having a miniaturized size of a length (L) of 0.4-1.0 mm, a width (W) of 0.2-0.5 mm and a thickness (T) of 0.2-0.5 mm, comprising the steps of:

1) prefabricating a diode chip formed from a transient voltage suppression (TVS) diode, a Schottky diode, a switch diode, a Zener diode or a rectifier diode, and having a bottom surface of which surface area is provided with a first positive electrode and a first negative electrode formed thereon and spaced apart each other as well as having a top surface provided with a second positive electrode and/or a second negative electrode;

2) prefabricating a bottom circuit board and a top circuit board both formed from a ceramic plate, a plastic plate, a composite sheet or a heat-dissipated plate and each having plural arrayed film circuits deposited thereon and each arrayed film circuit located in such a position spaced apart and adjacent to the other;

3) performing paste dispensing via charge-coupled device (CCD) image registration to print or dispense lead-free conductive paste onto two ends of each arrayed film circuits of the bottom circuit board of step 2);

4) performing chip bonding via CCD image registration to allow the first positive electrode and the first negative electrode of the diode chip of step 1) are through the lead-free conductive paste securely and electrically connected to two adjacent arrayed film circuits of the bottom circuit board of step 3);

5) performing paste dispensing via CCD image registration to print or dispense lead-free conductive paste onto the second positive electrode and/or the second negative electrode of the diode chip of step 4) thereof;

6) performing placing the top circuit board of step 2) covered on the top surface of the diode chip of step 5) via CCD image registration to allow the second positive electrode and/or the second negative electrode of the diode chip are through the lead-free conductive paste securely and electrically connected to each corresponding arrayed film circuit of the top circuit board thereof;

7) performing packaging an insulating package formed from a ceramic material or a plastic material and filled into a space between the bottom circuit board of step 6) and the top circuit board of step 6) to encase every bonded diode chip of step 6) and every arrayed film circuit on both the bottom circuit board and the top circuit board;

8) defining cutting lines across every arrayed film circuit of the bottom circuit board of step 7) and then performing cutting along the defined cutting lines via CCD image registration to obtain semi-finished diode packages each having three or four reversed circuit electrodes of which each has one end respectively exposed at one opposite end of the semi-finished diode package thereof; and 9) making outer electrodes covered at two end of the semi-finished diode package and electrically connected to the corresponding exposed circuit electrodes of the semi-finished diode package of step 8) via a coating, silver-dipping or film-making process, thereby the miniaturized SMD diode package is obtained.

* * * * *